United States Patent

Samsom et al.

[11] Patent Number: 5,911,064
[45] Date of Patent: Jun. 8, 1999

[54] CLOCK MULTIPLEXER WITH SELECTION AND DESELECTION OF CLOCK MODULES

[75] Inventors: Sebastianus M. Samsom, Zoetermeer; Aloysius P. Thijssen, Pijnacker; Keith Baker, Eindhoven, all of Netherlands

[73] Assignee: U.S. Philips Corporation, New York, N.Y.

[21] Appl. No.: 08/988,711

[22] Filed: Dec. 11, 1997

[30] Foreign Application Priority Data

Dec. 18, 1996 [EP] European Pat. Off. .............. 96203604

[51] Int. Cl.⁶ ...................................................... G06F 1/06
[52] U.S. Cl. ................................................................ 395/556
[58] Field of Search ................................... 395/555, 556; 331/46, 49, 56; 327/292, 298

[56] References Cited

U.S. PATENT DOCUMENTS 4,282,493 8/1981 Moreau ........................................ 331/2
5,444,714 8/1995 Yun .................................... 395/182.02

OTHER PUBLICATIONS

IBM Technical Disclosure Bulletin Jvol. 32 No. 9B (Feb. 1990), pp. 82–84.

*Primary Examiner*—Thomas M. Heckler
*Attorney, Agent, or Firm*—Brian J. Wieghaus

[57] ABSTRACT

A circuit includes a plurality of logically identical clock modules which are all capable of driving the same clock output. The circuit has a selection input for selecting one of the clock modules for driving the clock output. After a change of the selection, a clock module just deselected awaits the completion of a period of the own clock signal before switching to deselection. The clock modules have a hold-off input which is coupled to a common signal line. A newly selected clock module switches to a selection state only after a beginning of a period of the own clock signal, provided that the selected clock module previously detects a signal on its hold-off input which indicates that all clock modules have deselected themselves. The common signal line is preferably coupled to the clock output, deselection being detected on the basis of the signal level which occurs after the beginning of the period after a change of the selection.

9 Claims, 4 Drawing Sheets

CLOCK MULTIPLEXER WITH SELECTION AND DESELECTION OF CLOCK MODULES

BACKGROUND OF THE INVENTION

The invention relates to a circuit provided with a plurality of clock modules, each of which includes a clock input for an own clock signal, a clock output, a selection input for receiving a selection signal, each clock module being switchable, under the influence of the selection signal, between a selection state and a deselection state, in which states the own clock signal is passed to the clock output and not passed to the clock output, respectively, the clock module awaiting, after deselection by the selection signal, the completion of a period of the own clock signal before switching to the deselection state and the clock module switching to the selection state, after selection by the selection signal, only after a beginning of a period of the own clock signal, provided that a condition that all other clock modules be in the deselection state has been satisfied.

A circuit of this kind is known from a publication in IBM Technical Disclosure Bulletin Vol. 32 No. 9B (February 1990), pp. 82 to 84. This publication discloses a circuit comprising two clock modules. This circuit ensures that no glitches occur upon switching over from a state in which the own clock signal of one clock module is conducted to the state in which the own clock signal of the other clock module is conducted. The circuit conducts no more than one of the own clock signals at a time to the clock output. This is achieved in that each relevant clock module prevents the other clock module from entering the selection state if the relevant clock module itself is still in the selection state.

Each of the two clock modules includes a D flipflop whose state indicates whether the relevant clock module is in the selection state or in the deselection state. In order to prevent the clock modules from simultaneously passing their own clock signal, the data loaded into the D flipflop of one clock module is filtered in dependence on the state of the D flipflop in the other clock module and vice versa. For as long as the D flipflop of the one clock module indicates the selection state, only data indicating the deselection state can be loaded into the D flipflop of the other clock module. It is only when the D flipflop in the one clock module indicates that the one clock module is in the deselection state that the selection signal can be loaded into the D flipflop of the other clock module. This takes place in response to the rising edge of the own clock signal of the other clock module.

The cited IBM publication provides for the switching between two incoming clock signals. However, it is also desirable that switching can take place between different numbers of incoming clock signals, so also more than two, and preferably at a comparatively large number of points in an integrated circuit. The design work required for this purpose should be minimized, because the design of such circuits requires great care in respect of timing.

SUMMARY OF THE INVENTION

It is inter alia an object of the invention to provide a circuit of the kind set forth in which a standard design is used for a clock module, the standard design being independent of the number of incoming clock signals wherebetween switching can take place.

The circuit according to the invention is characterized in that at least two of the clock modules are logically identical, that each of said at least two clock modules includes a hold-off input which is coupled to a common signal line, and that the clock module tests said condition by detection of a signal on the hold-off input which indicates that all clock modules are in the deselection state. Thus, a standard design can be used for the at least two clock modules and the clock modules communicate via a common signal line serving each of the at least two clock modules, irrespective of the number of clock modules.

An embodiment of the circuit according to the invention is characterized in that the common signal line is coupled to the clock output, that the period terminates with a predetermined type of edge, and that each of the at least two clock modules detects the transition to the deselection state in the other clock module or modules on the basis of a passed edge in the output clock signal which occurs after the change of the selection signal and corresponds to the predetermined type. Thus, apart from the output clock signal which is required anyway no further general communication signals are required. Such general communication signals are susceptible to noise and must satisfy timing requirements which are difficult to verify during the design process and also difficult to test during production.

A further embodiment of the circuit according to the invention is characterized in that each of the at least two clock modules is provided with a reset input for receiving a reset signal and is arranged to switch the clock module to a reset state in response to the reset signal, the clock module switching, after termination of the reset signal, from said reset state to the deselection state if the clock module has not yet been selected by the selection signal, the clock module switching, after termination of the reset signal, from the reset state to the selection state if the clock module has been selected as yet by the section signal. Thus, the circuit can be prevented from entering an unrecoverable deadlock situation should a clock signal fail or should all clock modules enter the deselection state.

BRIEF DESCRIPTION OF THE DRAWINGS

These and other aspects and their advantages will be described in detail hereinafter with reference to the drawings.

DETAILED DESCRIPTION OF THE INVENTION

Figure 1:
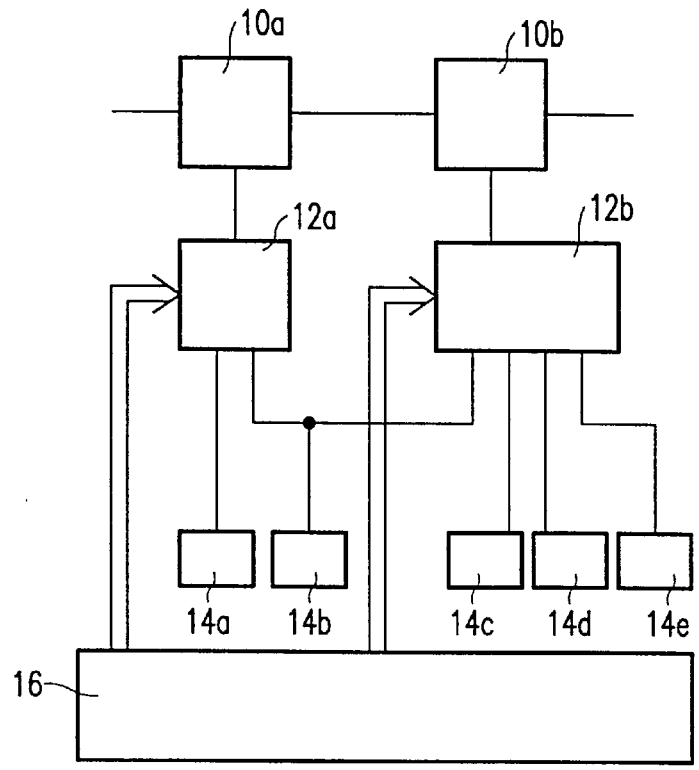
FIG. 1 shows a circuit including different clock selection units.

FIG. 1 shows an example of a circuit with different clock selection units 12a, 12b. The FIG. shows, by way of example, two clocked data processing units 10a,b. Each of the data processing units 10a,b receives a clock signal from an own clock selection unit 12a,b. The clock selection units 12a,b have, by way of example, two and four inputs, respectively. Also shown are a number of clock oscillators 14a–e which are coupled to the inputs of the clock selection units 12a, 12b. The circuit includes a control unit 16 which is coupled to the clock selection units 12a,b in order to present selection signals thereto.

During operation the control unit 16 selects the clock signal which is conducted to the data processing units 10a,b. During normal operation, for example clocks can be conducted to the respective data processing units 10a,b at maximum speed, or a clock signal of a frequency which is just high enough to complete the desired function in the relevant data processing unit 10a,b in time; the latter is done with a view to saving energy. Alternatively, the data processing units 10a,b may also receive different clock signals, whereas in the case of an exchange of data between the data processing units a switch-over is made to a common clock signal. In a test mode a data processing unit 10a,b can temporarily receive a different clock signal again.

The control unit 16 controls the selection of the clock by means of selection signals presented to the clock selection units 12a,b. Each clock selection unit 12a,b conducts a clock signal to the corresponding data processing unit 10a,b. This clock signal is chosen, depending on the selection signal received, from among the clock signals on the inputs of the clock selection units 12a,b.

Figure 2:
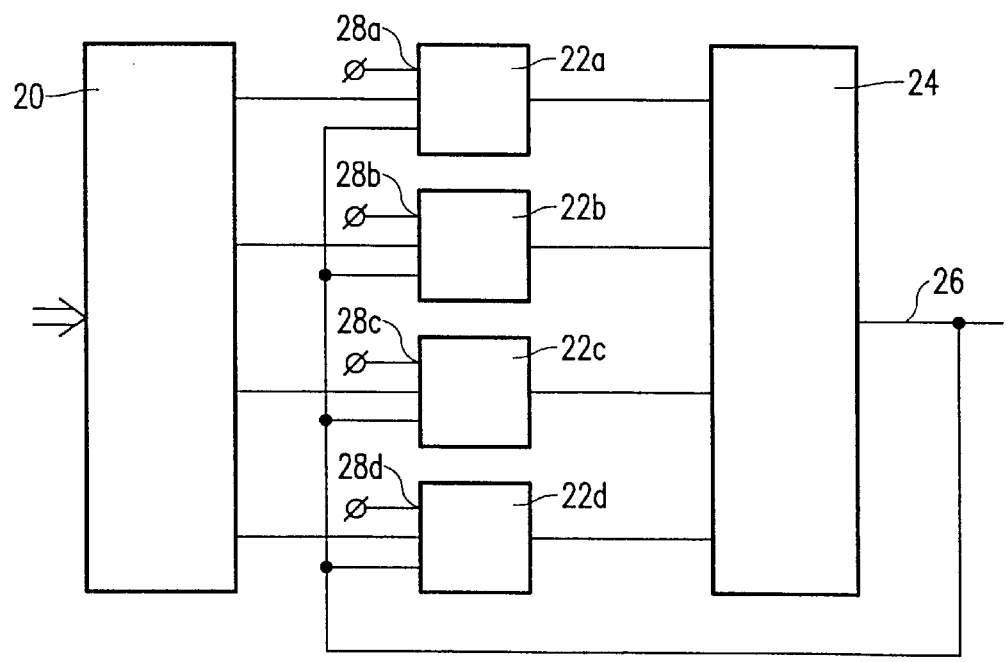
FIG. 2 shows an embodiment of a clock selection unit for use in a circuit according to the invention.

FIG. 2 shows an embodiment of a clock selection unit for use in a circuit according to the invention. The clock selection unit includes a decoder 20, a number of clock modules 22a–d and a combination unit 24. The clock modules 22a–d are identical. Each module has a clock input 28a–d for an own clock signal, a selection input which is coupled to the decoder 20, and a hold-off input which is coupled to the output 26 of the combination unit 24. The outputs of the clock modules 22a–d are coupled to the combination unit 24.

During operation the decoder 20 receives a selection code which designates one of the clock modules 22a–d. The decoder 20 converts the selection code into drive signals for the individual clock modules 22a–d, so that the selection input of the designated clock module 22a–d receives an active selection signal and the selection inputs of the other clock modules 22a–d receive passive selection signals. An own clock signal can be presented to the clock input 28a–d of each clock module. The clock module 22a–d receiving an active selection signal conducts its own clock signal to the combination unit 24. The remaining clock modules 22a–d do not conduct their own clock signals to the combination unit 24. The combination unit 24 in its turn conducts the conducted clock signal to the clock output 26. The combination unit is, for example a logic AND-gate. In that case the remaining clock modules 22a–d can permanently apply a logic high signal to the combination unit 24.

After a change of the selection code applied to the decoder 20, another clock module 22a–d will conduct its own clock signal to the combination unit 24. The occurrence of glitches on the clock output 26 must then be prevented, i.e. the output clock signal must be prevented from remaining at a logic level for less than a minimum time interval. This is achieved because, in response to the changing of the selection signal the clock modules assume a successive number of states under the influence of the own clock signal and the signal on the hold-off input.

Figure 3:
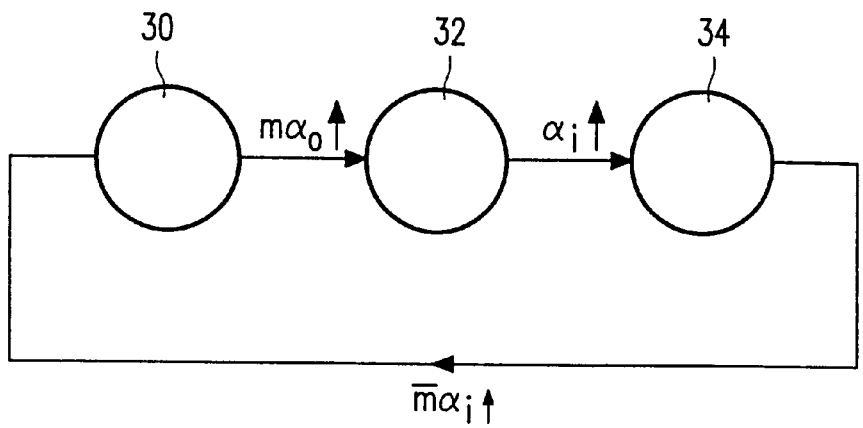
FIG. 3 shows a state diagram of a clock module for an embodiment of a circuit according to the invention.

FIG. 3 shows a state diagram of a clock module 22a–d. Each of the clock modules 22a–d per se operates according to such a state diagram. The state diagram shows a basic deselection state 30, an intermediate state 32 and a selection state 34. The clock module 22a–d is initially, for example in the basic deselection state 30. When the signal "m" is active on the selection input of the clock module 22a–d, the clock module will switch from the basic deselection state 30 to the intermediate state 32 in response to a rising edge of the output clock signal $\alpha_0$. The clock module 22a–d will subsequently switch to the selection state 34 in response to a rising edge of the own clock signal $\alpha_i$. In this state the clock module 22a–d conducts the own clock signal to the combination unit 24. When the signal "m" on the selection input of the clock module 22a–d is passive, the clock module will switch from the selection state 34 to the basic deselection state 30 in response to a rising edge of the own clock signal $\alpha_i$.

Figure 4:
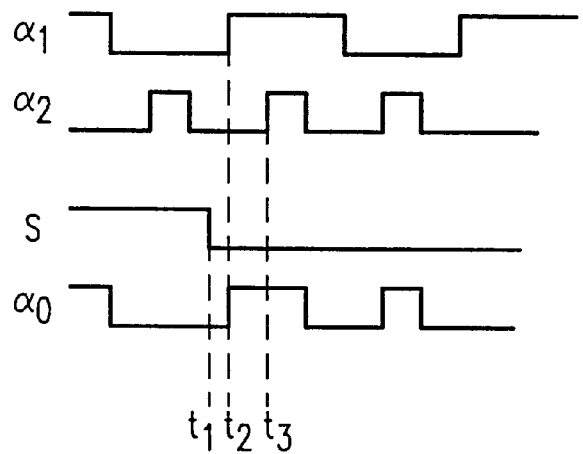
FIG. 4 shows a timing diagram for an embodiment of a circuit according to the invention.

The timing diagram of FIG. 4 illustrates the operation of the clock selection unit. The timing diagram contains four traces: the own clock signals $\alpha_1$, $\alpha_2$ on the clock inputs of two clock modules 22a–d, the selection signals s, ~s on the selection inputs of these clock modules 22a–d (shown as one trace), and the output clock signal $\alpha_0$ on the clock output 26 of the combination unit 24.

The selection signal "s" in the timing diagram switches over at an instant t1. Prior to the instant t1, a first clock module 22a–d, receiving the clock signal $\alpha_1$, receives an active selection signal and after the instant t1 a second clock module 22a–d, receiving a clock signal $\alpha_2$, receives an active selection signal. Prior to the instant t1, the first clock module 22a–d is in the selection state 34. In this selection state 34 the first clock module 22a–d conducts its own clock signal $\alpha_1$ to the clock output 26, which can be seen on the basis of the output clock signal $\alpha_0$. After the instant t1, the first clock module 22a–d switches to the basic deselection state 30 at an instant t2 of a rising edge in the own clock signal $\alpha_1$. The clock period of the own clock signal $\alpha_1$ which terminates with the rising edge is conducted to the clock output 26 up to an including said rising edge, but thereafter the output clock signal $\alpha_0$ is no longer dependent on the own clock signal $\alpha_1$ of the first clock module 22a–d. Prior to the instant t1, the second clock module 22a–d is in the basic deselection state 30. After the instant t1, a second clock module 22a–d, receiving the clock signal $\alpha_2$, receives an active selection signal. In response to the subsequent rising edge of the output signal $\alpha_0$, the second clock module 22a–d switches to the intermediate state 32. In the intermediate state 32 the own clock signal $\alpha_2$ is not yet conducted to the clock output 26. At the instant t3, the second clock module 22a–d switches to the selection state 34 in response to the subsequent rising edge of its own clock signal $\alpha_2$. As from that instant the own clock signal $\alpha_2$ of the second clock module 22a–d is conducted to the clock output 26. The output clock signal $\alpha_0$ thus corresponds to the own clock signal $\alpha_2$ as from the beginning of the clock period of the own clock signal $\alpha_2$ which commences with the rising edge (the actual conducting may commence later, because the own clock signal $\alpha_2$ still corresponds to the output clock signal $\alpha_0$ until the next falling edge).

Thus, on the basis of the rising edge of the output clock signal $\alpha_0$ at the instant t2, the second clock module 22a–d "sees" when the first clock module 22a–d leaves the selection state 34. Instead of the output clock signal $\alpha_0$, a separate signal may alternatively be applied to the clock modules 22a–d for this purpose, said separate signal being the logic "OR" of state flags of all clock modules 22a–d, each of which indicates whether the relevant clock module 22a–d is in the selection state 34 (not shown in FIG. 2). Such an additional general signal, however, may have the drawback of being susceptible to noise and difficult to test in respect of timing requirements.

The use of the output clock signal $\alpha_O$ for this purpose, however, may give rise to a deadlock situation if the selected clock fails (for example, during testing) or if all clock modules 22a–d are simultaneously in the basic deselection state. In that case a new selected clock module 22a–d cannot enter the selection state 34.

Figure 5:
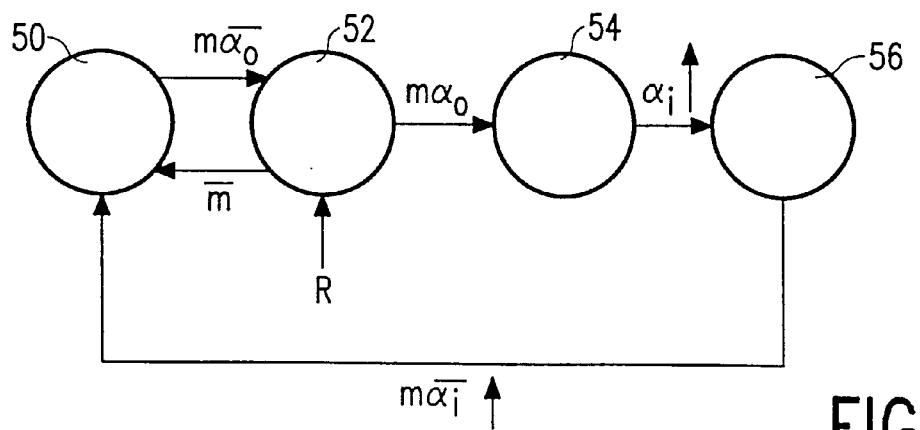
FIG. 5 shows a further state diagram for an embodiment of a circuit according to the invention.

FIG. 5 shows an improved state diagram shows for a clock module 22a–d. The state diagram shows four states: a basic deselection state 50, an intermediate state 54, a selection state 56 and a further intermediate state 52. The basic deselection state 50, the intermediate state 54 and the selection state 56 essentially have the same function as the corresponding states 30, 32 and 34 of FIG. 3. The transition between the basic deselection state 50 and the intermediate state 54, however, takes place via the further intermediate state 52. The clock module 22a–d switches from the basic deselection state 50 to the further intermediate state 52 if it receives an active selection signal "m" on the selection input and the output clock signal $\alpha_O$ is logic low. The clock module 22a–d switches from the further intermediate state 52 to the intermediate state 54 if it receives an active selection state "m" and the output clock signal $\alpha_O$ is logic high. Overall this has the same effect as the transition between the basic deselection state 30 and the intermediate state 32 in FIG. 3.

FIG. 5, however, also provides a reset signal R which is presented to all clock modules 22a–d (not shown in FIG. 2). If the reset signal R is active, all clock modules 22a–d are switched to the further intermediate state 52 (a clock module which is in the selection state at that instant preferably postpones this change over until the end of the period of the own clock signal if the own clock signal has the logic level prevailing directly before the end of the relevant period).

The clock module 22a–d is maintained in the intermediate state 52 for as long as the reset signal remains active. When the reset signal is no longer active, the clock module 22a–d switches from the further intermediate state 52 to the basic deselection state 50 if the selection signal "m" of the clock module 22a–d is passive. If the selection signal "m" of the clock module 22a–d is active, the clock module 22a–d switches from the further intermediate state 52 to the intermediate state 54 if the output clock signal $\alpha_O$ is also logic high. After an active reset signal, therefore, a clock module 22a–d can always be switched to the selection state again, even if the conducted clock signal failed before the reset signal or if all clock modules were in the basic deselection state.

Figure 6:
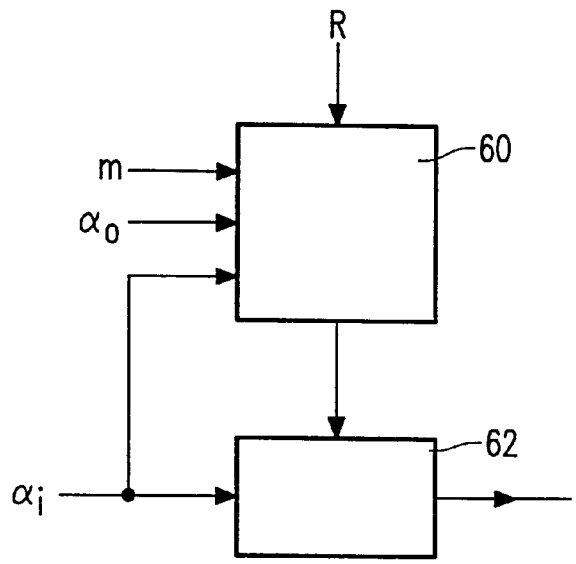
FIG. 6 shows an embodiment of a clock module for a circuit according to the invention.

FIG. 6 shows an embodiment of a clock module which includes a condition circuit 60 and a clock on/off switch circuit 62. The condition circuit 60 includes inputs for a selection signal "m", the output clock signal $\alpha_O$, the own clock signal $\alpha_i$ of the clock module, and the reset signal R. The condition circuit 60 includes an output which is coupled to the clock on/off switch circuit 62. The clock on/off switch circuit 62 also receives the own clock signal $\alpha_i$. An output of the clock on/off switch circuit 62 constitutes the output of the clock module which is coupled to the combination unit (not shown).

Figure 7:
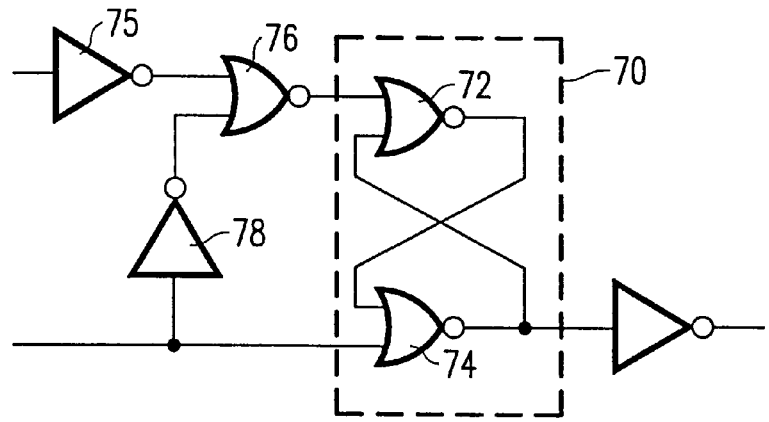
FIG. 7 shows an embodiment of a clock on/off switch for a circuit according to the invention.

FIG. 7 shows an embodiment of the clock on/off switch circuit 62. This circuit includes a flipflop 70 which, by way of example, is composed of a pair of cross-coupled NOR-gates 72, 74. An input for the clock signal $\alpha_i$ is coupled to a reset input RESET of the flipflop 70 and, via successively an inverter 78 and a NOR gate 76, to a set input SET of the flipflop 70. The NOR gate 76 receives not only the clock signal $\alpha_i$ but also the inverse of the selection signal s. During operation the clock on/off switch circuit 62 conducts the clock signal $\alpha_i$; if it has been selected by the selection signal s. The clock on/off switch circuit 62 ensures that the passive switching of the selection signal s has an effect only if or after the clock signal $\alpha_i$ has become logic high. A clock interval in which the clock signal $\alpha_i$ is logic low, therefore, is always completed. For as long as the selection signal s is active (high), the clock signal $\alpha_i$; will continuously switch the flipflop 70 from a set state to a reset state and vice versa. When the selection signal s is passive (low), the flipflop 70 will remain in the reset state. If the flipflop 70 is in the set state when the selection signal s is made passive, the flipflop 70 will switch to the reset state only in response to the next edge of the clock signal $\alpha_i$.

Figure 8:
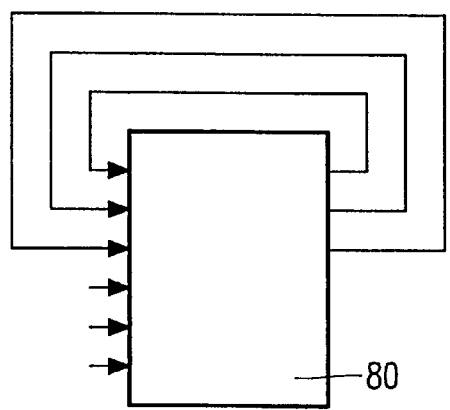
FIG. 8 shows an embodiment of a condition circuit for a circuit according to the invention.

FIG. 8 shows an embodiment of the condition circuit 60. This embodiment of the condition circuit is constructed as a state machine with a function block 80 having seven inputs and three outputs. The three outputs are retrocoupled to three of the inputs. The other inputs receive the own clock signal $\alpha_i$, the clock output signal $\alpha_O$, the selection signal m and the reset signal R, respectively. The function block 80 produces signals on the outputs as a combinatory logic function of the inputs (storage-free). As a result, the signal combination on the outputs of the function block 80 will successively assume a series of states under the influence of the own clock signal $\alpha_i$, the output clock signal $\alpha_O$, the selection signal $m_i$ and the reset signal R.

The state of the clock selection circuit as a whole is a combination of the state of the signal combination on the outputs of the function block 80 and the state of the clock on/off switch circuit. When the clock on/off switch circuit has two feasible states (as in FIG. 7 in which the state corresponds to the state of the flipflop 70), there are in principle two states of the clock selection circuit for each state of the signal combination on the outputs of the function block 80.

Figure 9:
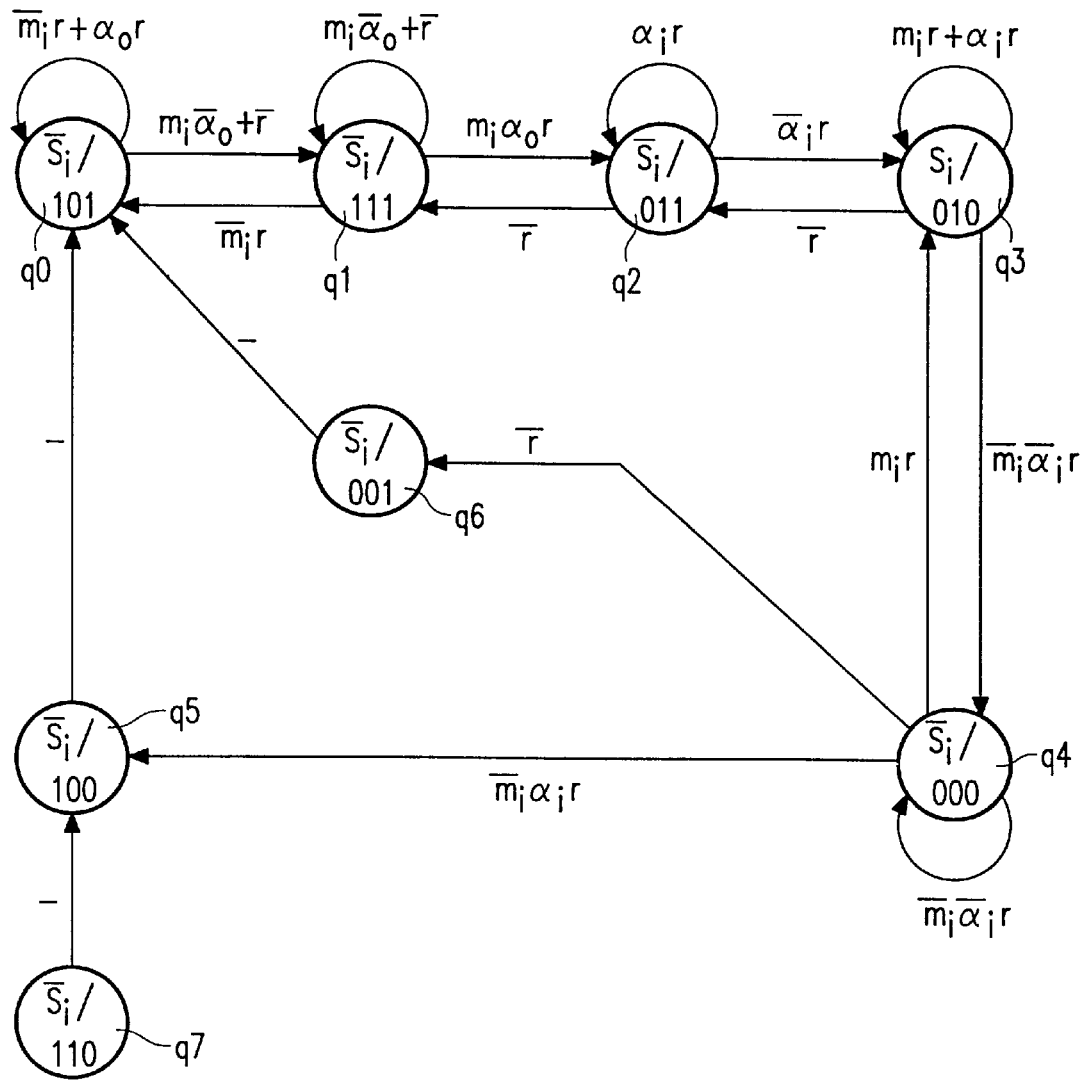
FIG. 9 shows an embodiment of a state diagram for a condition circuit according to the invention.

FIG. 9 shows a state diagram of the states assumed by the signal combination on the outputs of the function block 80. The state diagram includes a basic deselection state 90. From this state the condition circuit switches to a first intermediate state 91 if the selection signal $m_i$ is active and the output clock signal $\alpha_O$ is low or if the reset signal r is active. From the first intermediate state 91 the condition circuit can switch back to the basic deselection state 90 or to a second intermediate state 92. The condition circuit switches from the first intermediate state 91 to the second intermediate state 92 if the selection signal $m_i$ is active, the reset signal r is not active and the output clock signal $\alpha_O$ is high. The condition circuit switches from the first intermediate state 91 to the basic deselection state 90 if the selection signal $m_i$ as well as the reset signal r is not active. The condition circuit switches from the second intermediate state 92 to a selection state 93 if the input clock signal $\alpha_i$ is low and the reset signal r is not active. If the reset signal r is active, the condition circuit switches from the second intermediate state 92 to the first intermediate state 91. The condition circuit switches from the selection state 93 to a pre-deselection state 94 if the selection signal mi is not active, the input clock signal $\alpha_i$ is low and the reset signal r is not active. If the reset signal r is active, the condition circuit switches from the selection state 93 back to the second intermediate state 92. The condition circuit can switch to three states from the pre-deselection state 94: to a first further pre-deselection state 95, to a second further pre-deselection state 96, and back to the selection state 93. The latter takes place if the selection signal $m_i$ is active again whereas the reset signal r is not active. If the reset signal r is active, the condition circuit switches from the pre-deselection state 95 to the second further pre-deselection state 96. If the reset signal r and the selection signal mi are not active and the input clock signal is high, the condition circuit switches from the pre-deselection state 96 to the first further pre-deselection state 95. From the first and the second further pre-deselection states 95, 96, the condition circuit switches unconditionally to the basic deselection state 90.

The condition circuit generates an active selection signal s for the clock on/off circuit only in the selection state.

Each state 90, 91, 92, 93, 94, 95, 96 corresponds to a respective signal combination on the outputs of the function block 80. These signal combinations are chosen so that exactly one of the output signals of the function block 80 changes for any feasible state transition. By ensuring that not more signals change simultaneously, it is ensured that no race conditions can occur in the condition circuit.

During operation the state diagram ensures that, after the selection signal $m_i$ becomes active, the condition circuit enters the selection state 93 only after a low-high transition of the output clock signal $\alpha_o$ as soon as the input clock signal $\alpha_i$ is low. The condition circuit thus waits until it can be concluded on the basis of the output clock signal $\alpha_o$ that a previously active clock selection circuit is no longer in the selection state. Imposing the condition that the input clock signal $\alpha_i$ must be low prevents the occurrence of a metastable state on the input of the clock on/off switch circuit; such a state would occur if the selection signal s of that circuit were to become active just when the input clock signal $\alpha_i$ performs a transition, after which the clock on/off circuit must become insusceptible to changes in the selection signal s.

If the selection signal $m_i$ becomes passive, the condition circuit switches back to the basic deselection state 90, but only if the selection signal $m_i$ remains passive until a low-high transition of the input clock signal $\alpha_i$; the condition circuit remains selected otherwise. This is also the case if the selection signal $m_i$ disappears briefly after the second intermediate state 92 has been reached. Brief interruptions of the selection signal $m_i$ are thus prevented from causing unnecessary interruptions of the output clock signal $\alpha_o$.

If the reset signal r is active, the condition circuit switches to the first intermediate state 91 wherefrom it switches, in response to de-activation of the reset signal r, to the selection state 93 or to the basic deselection state 90, depending on the selection signal $m_i$.

We claim:

1. A circuit provided with a plurality of clock modules, each of which includes a clock input for an own clock signal, a clock output, a selection input for receiving a selection signal, each clock module being switchable, under the influence of the selection signal, between a selection state and a deselection state, in which states the own clock signal is passed to the clock output and not passed to the clock output, respectively, the clock module awaiting, after deselection by the selection signal, the completion of a period of the own clock signal before switching to the deselection state and the clock module switching to the selection state, after selection by the selection signal, only after a beginning of a period of the own clock signal, provided that a condition that all other clock modules be in the deselection state has been satisfied, characterized in that at least two of the clock modules are logically identical, that each of said at least two clock modules includes a hold-off input which is coupled to a common signal line, and that the clock module tests said condition by detection of a signal on the hold-off input which indicates that all clock modules are in the deselection state.

2. A circuit as claimed in claim 1, characterized in that the common signal line is coupled to the clock output, that the period terminates with a predetermined type of edge, and that each of the at least two clock modules detects the transition to the deselection state in the other clock module or modules on the basis of a passed edge in the output clock signal which occurs after the change of the selection signal and corresponds to the predetermined type.

3. A circuit as claimed in claim 2, characterized in that each of the at least two clock modules is provided with a reset input for receiving a reset signal and is arranged to switch the clock module to a reset state in response to the reset signal, the clock module switching, after termination of the reset signal, from said reset state to the deselection state if the clock module has not yet been selected by the selection signal, the clock module switching, after termination of the reset signal, from the reset state to the selection state if the clock module has been selected as yet by the selection signal.

4. A circuit as claimed in claim 3, provided with a plurality of clock sources, the clock input of each clock module being connected to a respective clock source.

5. A circuit as claimed in claim 4, in which the clock sources are asynchronous.

6. A circuit as claimed in claim 5, provided with a data processing unit whose data processing steps are clocked via the clock output.

7. A circuit as claimed in claim 1, provided with a plurality of clock sources, the clock input of each clock module being connected to a respective clock source.

8. A circuit as claimed in claim 7, in which the clock sources are asynchronous.

9. A circuit as claimed in claim 1, provided with a data processing unit whose data processing steps are clocked via the clock output.

* * * * *